United States Patent
Ogawa et al.

(10) Patent No.: US 11,424,127 B2
(45) Date of Patent: Aug. 23, 2022

(54) METHOD OF MANUFACTURING SEMICONDUCTOR DEVICE, SUBSTRATE PROCESSING APPARATUS, METHOD OF PROCESSING SUBSTRATE, AND RECORDING MEDIUM

(71) Applicant: KOKUSAI ELECTRIC CORPORATION, Tokyo (JP)

(72) Inventors: Arito Ogawa, Toyama (JP); Atsuro Seino, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/476,197

(22) Filed: Sep. 15, 2021

(65) Prior Publication Data
US 2022/0093404 A1    Mar. 24, 2022

(30) Foreign Application Priority Data
Sep. 18, 2020  (JP) .............................. JP2020-157225

(51) Int. Cl.
*H01L 21/285* (2006.01)
*C23C 16/18* (2006.01)
*C23C 16/455* (2006.01)

(52) U.S. Cl.
CPC ........ *H01L 21/28568* (2013.01); *C23C 16/18* (2013.01); *C23C 16/45527* (2013.01); *C23C 16/45553* (2013.01); *H01L 21/28556* (2013.01)

(58) Field of Classification Search
CPC ....................................................... C23C 16/18
See application file for complete search history.

(56) References Cited

U.S. PATENT DOCUMENTS

| | | | |
|---|---|---|---|
| 2005/0227003 A1* | 10/2005 | Carlson | ................. C23C 16/40 427/248.1 |
| 2016/0079056 A1 | 3/2016 | Harada et al. | |
| 2016/0284552 A1 | 9/2016 | Ogawa | |
| 2016/0305017 A1 | 10/2016 | Ogawa et al. | |
| 2020/0194269 A1 | 6/2020 | Ogawa et al. | |

FOREIGN PATENT DOCUMENTS

| | | |
|---|---|---|
| JP | 2011-066263 A | 3/2011 |
| JP | 2013-076157 A | 4/2013 |
| JP | 2016-063007 A | 4/2016 |
| JP | 2016-186969 A | 10/2016 |
| WO | 2019/058608 A1 | 3/2019 |

OTHER PUBLICATIONS

Japanese Office Action dated May 10, 2022 for Japanese Patent Application No. 2020-157225.

* cited by examiner

*Primary Examiner* — Selim U Ahmed
*Assistant Examiner* — Evan G Clinton
(74) *Attorney, Agent, or Firm* — Volpe Koenig

(57) ABSTRACT

There is included (a) supplying a gas containing an organic ligand to a substrate; (b) supplying a metal-containing gas to the substrate; and (c) supplying a first reducing gas to the substrate, wherein after (a), a metal-containing film is formed on the substrate by performing (b) and (c) one or more times, respectively.

18 Claims, 14 Drawing Sheets

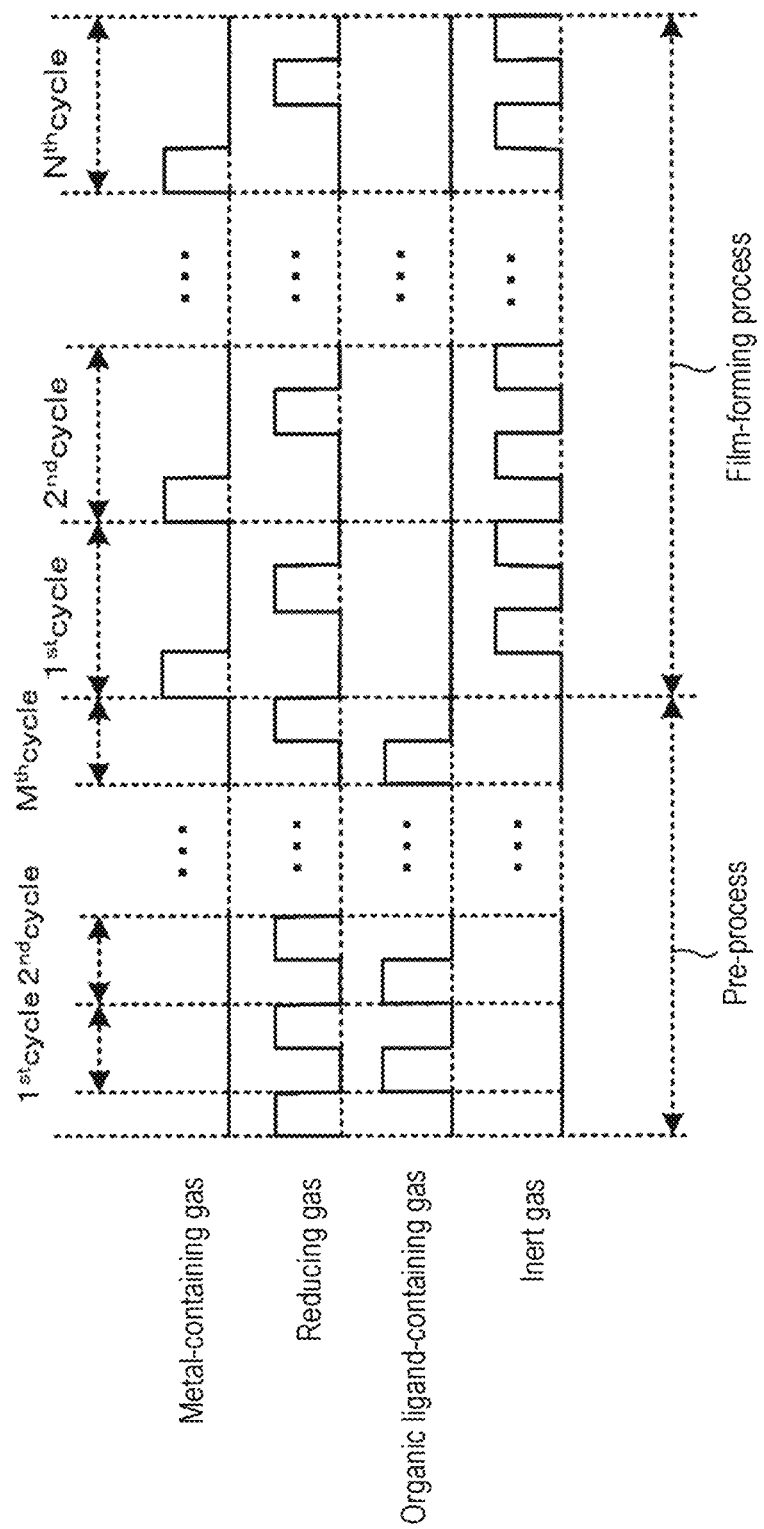

FIG. 14

| Target | 20 Å | | | |
|---|---|---|---|---|
| Sample | Sample 1 | Sample 2 | Sample 3 | Sample 4 |
| TEM image | | | | |
| Film thickness | 21.9 Å | 22.7 Å | 21.3 Å | 20.5 Å |
| Particle ratio of TiN on SiO | 50.6% | 53.8% | 55.0% | 46.2% |

METHOD OF MANUFACTURING SEMICONDUCTOR DEVICE, SUBSTRATE PROCESSING APPARATUS, METHOD OF PROCESSING SUBSTRATE, AND RECORDING MEDIUM

CROSS-REFERENCE TO RELATED APPLICATION(S)

This application is based upon and claims the benefit of priority from Japanese Patent Application No. 2020-157225, filed on Sep. 18, 2020, the entire contents of which are incorporated herein by reference.

TECHNICAL FIELD

The present disclosure relates to a method of manufacturing a semiconductor device, a substrate processing apparatus, a method of processing a substrate, and recording medium.

BACKGROUND

For example, a low resistance tungsten (W) film is used for a word line of a NAND flash memory or a DRAM having a three-dimensional structure. Further, for example, a titanium nitride (TiN) film may be used for a barrier film between the W film and an insulating film.

SUMMARY

However, since the burial width of a groove forming the W film is fine, if the TiN film is not flat, the volume of the W film decreases, which makes it difficult to reduce the resistance of the W film.

Some embodiments of the present disclosure provide a technique capable of improving the characteristics of a metal-containing film.

According to one or more embodiments of the present disclosure, there is provided a technique that includes (a) supplying a gas containing an organic ligand to a substrate; (b) supplying a metal-containing gas to the substrate; and (c) supplying a first reducing gas to the substrate, wherein after (a), a metal-containing film is formed on the substrate by performing (b) and (c) one or more times, respectively.

BRIEF DESCRIPTION OF DRAWINGS

The accompanying drawings, which are incorporated in and constitute a part of the specification, illustrate embodiments of the present disclosure.

FIG. 8 is a diagram showing a modification of the substrate-processing sequence according to the embodiments of the present disclosure.

FIG. 14 is a view showing a comparison between TEM images of TiN films formed on substrates of Samples 1 to 4 by different substrate-processing sequences.

DETAILED DESCRIPTION

Figure 1:
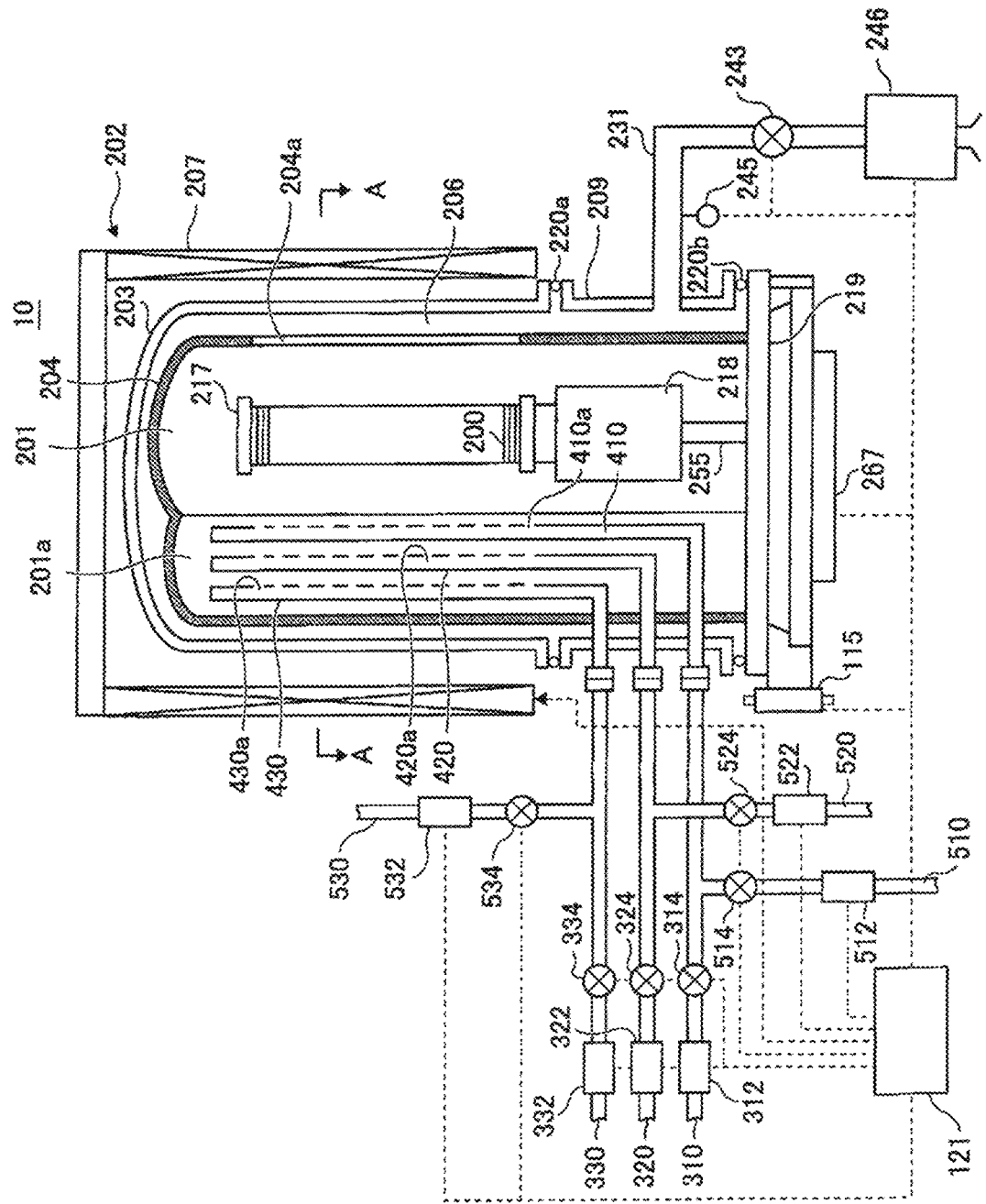
FIG. 1 is a longitudinal sectional view showing the outline of a vertical process furnace of a substrate processing apparatus according to one or more embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or more embodiments of the present disclosure will now be described with reference to FIGS. 1 to 5C. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

A substrate processing apparatus 10 includes a process furnace 202 in which a heater 207 as a heating means (a heating mechanism or a heating system) is installed. The heater 207 has a cylindrical shape and is supported by a heat base (not shown) as a support plate so as to be vertically installed.

An outer tube 203 forming a process container is disposed inside the heater 207 to be concentric with the heater 207. The outer tube 203 is made of, for example, a heat resistant material such as quartz ($SiO_2$) or silicon carbide (SiC) and has a cylindrical shape with its upper end closed and its lower end opened. A manifold (inlet flange) 209 is disposed below the outer tube 203 to be concentric with the outer tube 203. The manifold 209 is made of, for example, a metal material such as stainless steel (SUS) and is formed in a cylindrical shape with its upper and lower ends opened. An O-ring 220a serving as a seal member is installed between the upper end portion of the manifold 209 and the outer tube 203. When the manifold 209 is supported by the heater base, the outer tube 203 is in a state of being installed vertically.

An inner tube 204 forming the process container is disposed inside the outer tube 203. The inner tube 204 is made of, for example, a heat resistant material such as quartz ($SiO_2$) or silicon carbide (SiC) and is formed in a cylindrical shape with it upper end closed and its lower end opened. The process container mainly includes the outer tube 203, the inner tube 204, and the manifold 209. A process chamber 201 is formed in a hollow cylindrical portion (inside the inner tube 204) of the process container.

The process chamber 201 is configured to be able to accommodate wafers 200 as substrates in a state where the wafers 200 are arranged in a horizontal posture and in multiple stages in the vertical direction by a boat 217 which will be described later.

Nozzles 410, 420, and 430 are installed in the process chamber 201 so as to penetrate through a sidewall of the manifold 209 and the inner tube 204. Gas supply pipes 310, 320, and 330 are connected to the nozzles 410, 420, and 430, respectively. However, the process furnace 202 of the present embodiments is not limited to the above-described shape.

Mass flow controllers (MFCs) 312, 322, and 332, which are flow rate controllers (flow rate control parts), are installed in the gas supply pipes 310, 320, and 330, respectively, sequentially from the upstream side. Further, valves 314, 324, and 334, which are opening/closing valves, are installed in the gas supply pipes 310, 320, and 330, respectively. Gas supply pipes 510, 520, and 530 configured to supply an inert gas are connected at the downstream side of the valves 314, 324, and 334 of the gas supply pipes 310, 320, and 330, respectively. MFCs 512, 522, and 532, which are flow rate controllers (flow rate control parts), and valves 514, 524, and 534, which are opening/closing valves, are installed in the gas supply pipes 510, 520, and 530, respectively, sequentially from the upstream side.

The nozzles 410, 420, and 430 are connected to the leading ends of the gas supply pipes 310, 320, and 330, respectively. The nozzles 410, 420, and 430 are configured as L-shaped nozzles, and their horizontal portions are installed so as to penetrate through the sidewall of the manifold 209 and the inner tube 204. The vertical portions of the nozzles 410, 420, and 430 are installed inside a channel-shaped (groove-shaped) auxiliary chamber 201a formed so as to protrude outward in the radial direction of the inner tube 204 and extend in the vertical direction thereof and are also installed in the auxiliary chamber 201a toward the upper side (upper side in the arrangement direction of the wafers 200) along the inner wall of the inner tube 204.

The nozzles 410, 420, and 430 are installed so as to extend from a lower region of the process chamber 201 to an upper region of the process chamber 201, and a plurality of gas supply holes 410a, 420a, and 430a are installed at positions facing the wafers 200, respectively. Thus, a process gas is supplied to the wafers 200 from the gas supply holes 410a, 420a, and 430a of the respective nozzles 410, 420, and 430. The gas supply holes 410a, 420a, and 430a are installed from a lower portion of the inner tube 204 to an upper portion thereof and have the same aperture area at the same aperture pitch. However, the gas supply holes 410a, 420a, and 430a are not limited to the above-described shape. For example, the aperture area may be gradually increased from the lower portion of the inner tube 204 to the upper portion thereof. This makes it possible to make the flow rate of the gas supplied from the gas supply holes 410a, 420a, and 430a more uniform.

The gas supply holes 410a, 420a, and 430a of the nozzles 410, 420, and 430 are formed at height positions from a lower portion of the boat 217, which will be described later, to an upper portion thereof. Therefore, the process gas supplied into the process chamber 201 from the gas supply holes 410a, 420a, and 430a of the nozzles 410, 420, and 430 is supplied to the entire region of the wafers 200 accommodated from the lower portion of the boat 217 to the upper portion thereof. The nozzles 410, 420, and 430 are installed so as to extend from the lower region of the process chamber 201 to the upper region thereof, but may be installed so as to extend to the vicinity of the ceiling of the boat 217.

As the process gas, a metal-containing gas is supplied into the process chamber 201, from the gas supply pipe 310 via the MFC 312, the valve 314, and the nozzle 410.

As the process gas, an organic ligand-containing gas, which is a gas containing an organic ligand, is supplied into the process chamber 201, from the gas supply pipe 320 via the MFC 322, the valve 324, and the nozzle 420.

As the process gas, a reducing gas is supplied into the process chamber 201, from the gas supply pipe 330 via the MFC 332, the valve 334, and the nozzle 430.

As an inert gas, for example, a nitrogen ($N_2$) gas is supplied into the process chamber 201, from the gas supply pipes 510, 520, and 530 via the MFCs 512, 522, and 532, the valves 514, 524, and 534, and the nozzles 410, 420, and 430, respectively. Hereinafter, an example in which the $N_2$ gas is used as the inert gas will be described. However, as the inert gas, in addition to the $N_2$ gas, it may be possible to use, e.g., a rare gas such as an argon (Ar) gas, a helium (He) gas, a neon (Ne) gas, a xenon (Xe), or the like.

A process gas supply system mainly includes the gas supply pipes 310, 320, and 330, the MFCs 312, 322, and 332, the valves 314, 324, and 334, and the nozzles 410, 420, and 430. However, the process gas supply system may include only the nozzles 410, 420, and 430. The process gas supply system may be simply referred to as a gas supply system. When the metal-containing gas is flowed from the gas supply pipe 310, a metal-containing gas supply system mainly includes the gas supply pipe 310, the MFC 312, and the valve 314. However, the metal-containing gas supply system may include the nozzle 410. Further, when the gas containing the organic ligand is flowed from the gas supply pipe 320, an organic ligand-containing gas supply system mainly includes the gas supply pipe 320, the MFC 322, and the valve 324. However, the organic ligand-containing gas supply system may include the nozzle 420. Further, when the reducing gas is flowed from the gas supply pipe 330, a reducing gas supply system mainly includes the gas supply pipe 330, the MFC 332, and the valve 334. However, the reducing gas supply system may include the nozzle 430. When a N-containing gas as the reducing gas is supplied from the gas supply pipe 330, the reducing gas supply system may be referred to as a N-containing gas supply system. Further, an inert gas supply system mainly includes the gas supply pipes 510, 520, and 530, the MFC 512, 522, and 532, and the valves 514, 524, and 534.

A method of supplying a gas in the present embodiments is to transfer a gas via the nozzles 410, 420, and 430 arranged in the auxiliary chamber 201a in an annular vertically long space defined by the inner wall of the inner tube 204 and the ends of a plurality of wafers 200. Then, the gas is ejected into the inner tube 204 from the plurality of gas supply holes 410a, 420a, and 430a installed at positions of the nozzles 410, 420, and 430, which face the wafers. More specifically, the process gas or the like is ejected toward a direction parallel to the surface of the wafers 200 by the gas supply hole 410a of the nozzle 410, the gas supply hole 420a of the nozzle 420, and the gas supply hole 430a of the nozzle 430.

An exhaust hole (exhaust port) 204a is a through-hole formed in a sidewall of the inner tube 204 at a position facing the nozzles 410, 420, and 430. For example, the exhaust hole 204a is a slit-shaped through-hole formed elongated in the vertical direction. A gas supplied into the process chamber 201 from the gas supply holes 410a, 420a, and 430a of the nozzles 410, 420, and 430 and flowing on the surface of the wafers 200 passes through the exhaust hole 204a and flows into an exhaust passage 206 consisting of a gap formed between the inner tube 204 and the outer tube 203. Then, the gas flowed into the exhaust passage 206 flows into an exhaust pipe 231 and is discharged to the outside of the process furnace 202.

The exhaust hole 204a are formed at a position facing the plurality of wafers 200, and a gas supplied from the gas supply holes 410a, 420a, and 430a to the vicinity of the wafers 200 in the process chamber 201 flows toward the horizontal direction and then flows into the exhaust passage 206 through the exhaust hole 204a. The exhaust hole 204a is not limited to the slit-shaped through-hole, but may be configured by a plurality of holes.

The exhaust pipe 231 configured to exhaust an internal atmosphere of the process chamber 201 is installed in the manifold 209. A pressure sensor 245, which is a pressure detector (pressure detecting part) configured to detect an internal pressure of the process chamber 201, an auto pressure controller (APC) valve 243, and a vacuum pump 246 as a vacuum-exhausting device, are connected to the exhaust pipe 231 sequentially from the upstream side. The APC valve 243 can perform or stop a vacuum-exhausting operation in the process chamber 201 by opening or closing the valve while the vacuum pump 246 is actuated, and can also adjust the internal pressure of the process chamber 201 by adjusting an opening degree of the valve while the vacuum pump 246 is actuated. An exhaust system mainly includes the exhaust hole 204a, the exhaust passage 206, the exhaust pipe 231, the APC valve 243, and the pressure sensor 245. The exhaust system may include the vacuum pump 246.

A seal cap 219 serving as a furnace opening cover configured to hermetically seal a lower end opening of the manifold 209 is installed under the manifold 209. The seal cap 219 is configured to come into contact with the lower end of the manifold 209 from the lower side in the vertical direction. The seal cap 219 is made of, for example, a metal material such as stainless steel (SUS), and is formed in a disc shape. An O-ring 220b as a seal member making contact with the lower end of the manifold 209 is installed on an upper surface of the seal cap 219. A rotation mechanism 267 configured to rotate the boat 217 in which the wafers 200 are accommodated is installed on the opposite side of the process chamber 201 in the seal cap 219. A rotary shaft 255 of the rotation mechanism 267 penetrates through the seal cap 219 and is connected to the boat 217. The rotation mechanism 267 is configured to rotate the wafers 200 by rotating the boat 217. The seal cap 219 is configured to be vertically moved up and down by a boat elevator 115 as an elevation mechanism vertically installed outside the outer tube 203. The boat elevator 115 is configured to be able to load/unload the boat 217 into/from the process chamber 201 by moving the seal cap 219 up and down. The boat elevator 115 is configured as a transfer device (transfer mechanism) which transfers the boat 217 and the wafers 200 accommodated in the boat 217 into/out of the process chamber 201.

The boat 217 serving as a substrate support is configured to arrange a plurality of wafers 200, for example, 25 to 200 wafers 200, at intervals in the vertical direction in a horizontal posture with the centers of the wafers 200 aligned with one another. The boat 217 is made of, for example, a heat resistant material such as quartz or SiC. Heat-insulating plates 218 made of, for example, a heat resistant material such as quartz or SiC, are supported in a horizontal posture and in multiple stages (not shown) below the boat 217. This configuration makes it difficult to transfer heat from the heater 207 to the seal cap 219 side. However, the present embodiments are not limited to the above-described embodiments. For example, instead of installing the heat-insulating plates 218, a heat-insulating cylinder configured as a cylindrical member made of a heat resistant material such as quartz or SiC may be installed below the boat 217.

Figure 2:
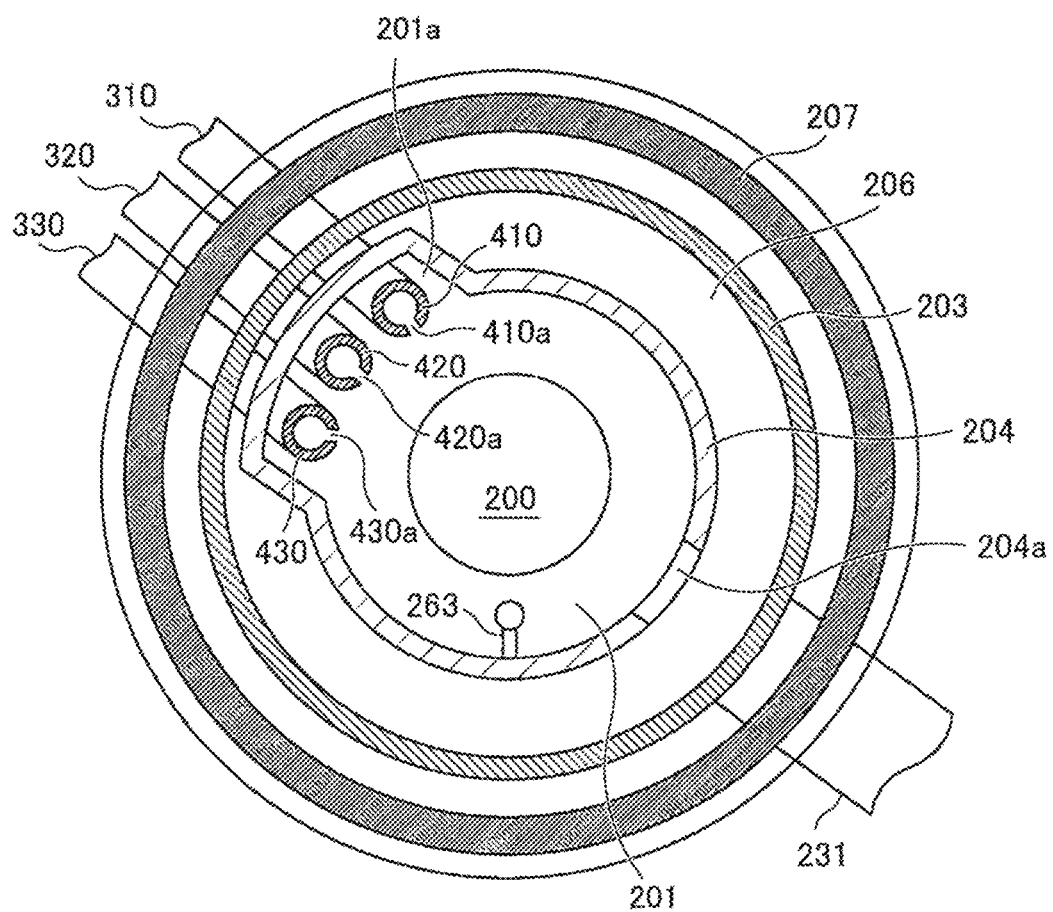
FIG. 2 is a schematic cross-sectional view taken along line A-A in FIG. 1.

As shown in FIG. 2, a temperature sensor 263 serving as a temperature detector is installed in the inner tube 204. Based on temperature information detected by the temperature sensor 263, a degree of supplying electric power to the heater 207 is adjusted such that the interior of the process chamber 201 has a desired temperature distribution. The temperature sensor 263 is configured as an L-shape, like the nozzles 410, 420, and 430, and is installed along the inner wall of the inner tube 204.

Figure 3:
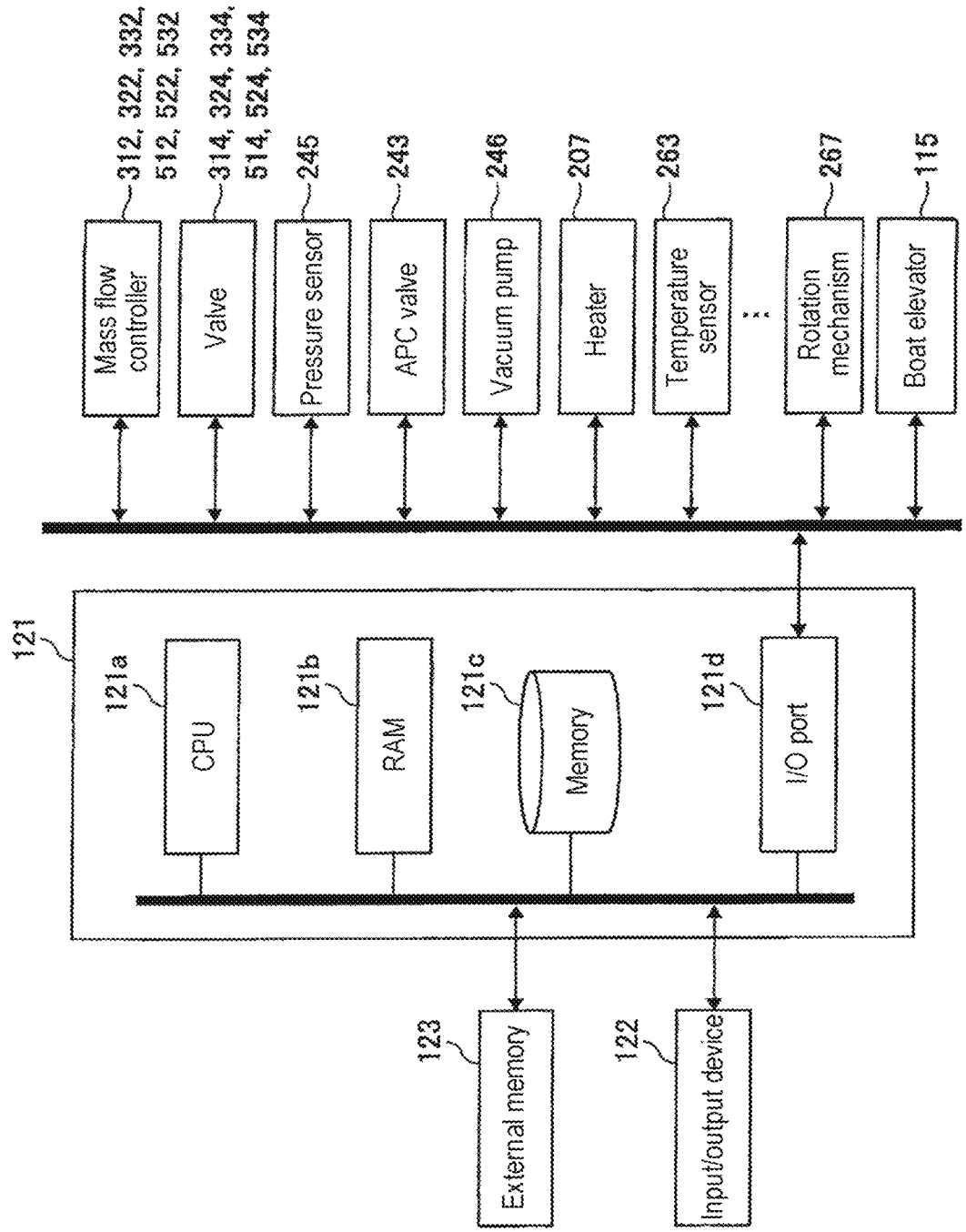
FIG. 3 is a schematic configuration diagram of a controller of the substrate processing apparatus according to the embodiments of the present disclosure, in which a control system of the controller is illustrated in a block diagram.

As shown in FIG. 3, a controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to exchange data with the CPU 121a via an internal bus. An input/output device 122 formed of, e.g., a touch panel or the like, is connected to the controller 121.

The memory 121c is configured by, for example, a flash memory, a hard disk drive (HDD), or the like. A control program for controlling operations of a substrate processing apparatus and a process recipe, in which sequences and conditions of a method of manufacturing a semiconductor device, which will be described later, are written, are readably stored in the memory 121c. The process recipe functions as a program for causing the controller 121 to execute each step in the method of manufacturing a semiconductor device, which will be described later, to obtain a predetermined result. Hereinafter, the process recipe and the control program may be generally and simply referred to as a "program." When the term "program" is used herein, it may indicate a case of including the process recipe only, a case of including the control program only, or a case of including both the process recipe and the control program. The RAM 121b is configured as a memory area (work area) in which a program or data read by the CPU 121a is temporarily stored.

The I/O port 121d is connected to the MFCs 312, 322, 332, 512, 522, and 532, the valves 314, 324, 334, 514, 524, and 534, the pressure sensor 245, the APC valve 243, the vacuum pump 246, the heater 207, the temperature sensor 263, the rotation mechanism 267, the boat elevator 115, and the like.

The CPU 121a is configured to read and execute the control program from the memory 121c. The CPU 121a is also configured to read the recipe from the memory 121c according to an input of an operation command from the input/output device 122. The CPU 121a is configured to control the flow rate adjustment operation of various kinds of gases by the MFCs 312, 322, 332, 512, 522, and 532, the opening/closing operation of the valves 314, 324, 334, 514, 524, and 534, the opening/closing operation of the APC valve 243, the pressure-adjusting operation performed by the APC valve 243 based on the pressure sensor 245, the temperature adjustment operation performed by the heater 207 based on the temperature sensor 263, the actuating and stopping of the vacuum pump 246, the operation of rotating the boat 217 and adjusting the rotation speed of the boat 217 by the rotation mechanism 267, the operation of moving the boat 217 up and down by the boat elevator 115, the operation of accommodating the wafers 200 in the boat 217, and the like, according to contents of the read recipe.

The controller 121 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, a semiconductor memory such as a USB memory or a memory card, and the like) 123. The memory 121c and the external memory 123 are configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. The program may be provided to the computer using a communication means such as the Internet or a dedicated line, instead of using the external memory 123.

(2) Substrate-Processing Process

As one of processes of manufacturing a semiconductor device, an example of a process of forming a TiN film, which is a metal-containing film, on a wafer 200 will be described with reference to FIGS. 4 and 5A to 5C. The process of forming the TiN film is performed by using the process furnace 202 of the above-described substrate processing apparatus 10. In the following description, the operations of various parts constituting the substrate processing apparatus 10 are controlled by the controller 121.

A substrate-processing process (a process of manufacturing a semiconductor device) according to the present embodiments includes:

(a) a step of accommodating a wafer 200 in a process container;

(b) a step of supplying an organic ligand-containing gas to the wafer 200;

(c) a step of supplying a metal-containing gas to the wafer 200; and (d) a step of supplying a first reducing gas to the wafer 200, wherein after (b), a metal-containing film is formed on the wafer 200 by performing (c) and (d) one or more times, respectively.

When the term "wafer" is used in the present disclosure, it may refer to "a wafer itself" or "a wafer and a laminated body of certain layers or films formed on a surface of a wafer." When the phrase "a surface of a wafer" is used in the present disclosure, it may refer to "a surface of a wafer itself" or "a surface of a certain layer or film formed on a wafer". When the term "substrate" is used in the present disclosure, it may be synonymous with the term "wafer."

(Wafer Loading)

When a plurality of wafers 200 are charged on the boat 217 (wafer charging), as shown in FIG. 1, the boat 217 supporting the plurality of wafers 200 is lifted up by the boat elevator 115 and is loaded into the process chamber 201 (boat loading) and accommodated in the process container. In this state, the seal cap 219 seals the lower end opening of the outer tube 203 via the O-ring 220.

(Pressure Adjustment and Temperature Adjustment)

The interior of the process chamber 201, in which the wafers 200 exist, is vacuum-exhausted by the vacuum pump 246 to reach a desired pressure (degree of vacuum). At this time, the internal pressure of the process chamber 201 is measured by the pressure sensor 245. The APC valve 243 is feedback-controlled based on the measured pressure information (pressure adjustment). The vacuum pump 246 always keeps in operation at least until the process to the wafers 200 is completed. The interior of the process chamber 201 is heated by the heater 207 to have a desired processing temperature. At this time, the degree of supplying electric power to the heater 207 is feedback-controlled based on the temperature information detected by the temperature sensor 263 such that the interior of the process chamber 201 has a desired temperature distribution (temperature adjustment). Heating the interior of the process chamber 201 by the heater 207 may be continuously performed at least until the process to the wafers 200 is completed.

[Pre-process] (Organic Ligand-Containing Gas Supply)

The valve 324 is opened to allow an organic ligand-containing gas to flow into the gas supply pipe 320. The flow rate of the organic ligand-containing gas is adjusted by the MFC322, and the organic ligand-containing gas is supplied into the process chamber 201 from the gas supply hole 420a of the nozzle 420 and is exhausted through the exhaust pipe 231. At the same time, the valve 524 may be opened to allow an inert gas such as a $N_2$ gas to flow into the gas supply pipe 520. Further, in order to prevent the organic ligand-containing gas from penetrating into the nozzles 410 and 430, the valves 514 and 534 may be opened to allow an inert gas to flow into the gas supply pipes 510 and 530.

At this time, the APC valve 243 is adjusted so that the internal pressure of the process chamber 201 is set to a pressure within the range of, for example, 1 to 3,990 Pa. The supply flow rate of the organic ligand-containing gas controlled by the MFC322 is set to a flow rate within the range of, for example, 0.01 to 5.0 slm. In the following, the temperature of the heater 207 is set to a temperature such that the temperature of the wafer 200 is a temperature within the range of, for example, 300 to 550 degrees C. The notation of a numerical range such as "1 to 3,990 Pa" in the present disclosure means that the lower limit value and the upper limit value are included in the range. Therefore, for example, "1 to 3,990 Pa" means "1 Pa or more and 3,990 Pa or less." The same applies to other numerical ranges.

Figure 5A:
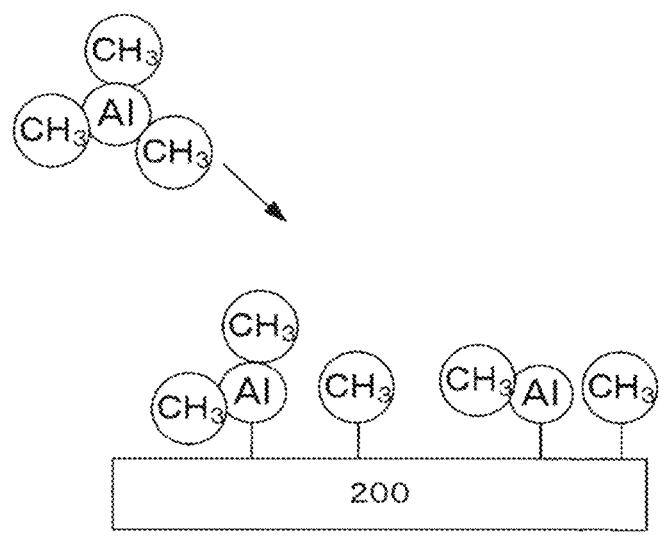
FIGS. 5A to 5C are schematic views for explaining the state of a substrate surface in the substrate-processing sequence shown in FIG. 4.

In this operation, the organic ligand-containing gas is supplied to the wafer 200. As the organic ligand-containing gas, it may be possible to use a gas containing a hydrocarbon group (CH—) such as a gas containing an alkyl group, for example, a gas containing a methyl group, or a gas containing a metal element such as a trimethylaluminum (($CH_3)_3$ Al) gas (hereinafter referred to as a TMA gas). When the TMA gas is used as the organic ligand-containing gas, a methyl group (—$CH_3$), which is an organic ligand, a hydrocarbon group, and an alkyl group, is adsorbed on the wafer 200 (a base film on the surface of the wafer 200) by the supply of the organic ligand-containing gas, as shown in FIG. 5A. Further, as shown in FIG. 5A, Al atoms in a state in which a methyl group is bonded thereto may be adsorbed on the wafer 200 (the base film on the surface of the wafer 200). In any case, the surface of the wafer 200 is terminated with the methyl group by the supply of the organic ligand-containing gas. In the present disclosure, the terms "terminated" and "adsorbed" may include a state in which the entire surface of the wafer 200 is not covered. Depending on the gas supply conditions and the surface condition of the wafer 200, the entire surface of the wafer 200 may not be covered. Also, if a reaction stops in a self-limited manner, the entire surface of the wafer 200 may not be covered.

Here, the metal element contained in the organic ligand-containing gas is a non-transition metal element and is preferably an element different from a metal element contained in a metal-containing gas in a film-forming process which will be described later. For example, as illustrated in the present embodiments, when a metal-containing film to be formed is a TiN film, a gas containing Al is used as a gas containing the organic ligand.

[Film-Forming Process (Metal-Containing Film-Forming Process)]

After supplying the organic ligand-containing gas onto the wafer 200 according to the above-described pre-process, the following first to fourth steps are repeatedly performed. That is, after supplying the organic ligand-containing gas, the following first to fourth steps are repeatedly performed without supplying a purge gas. That is, in a state in which the organic ligand is adsorbed on the wafer 200, the following first to fourth steps are repeatedly performed on the wafer 200 on which the organic ligand is exposed.

(Metal-Containing Gas Supply: First Step)

The valve 314 is opened to allow a metal-containing gas to flow into the gas supply pipe 310. The flow rate of the metal-containing gas is adjusted by the MFC 312, and the metal-containing gas is supplied into the process chamber 201 from the gas supply hole 410a of the nozzle 410 and is exhausted through the exhaust pipe 231. At the same time, the valve 514 may be opened to allow an inert gas such as a $N_2$ gas flow into the gas supply pipe 510. At this time, in order to prevent the metal-containing gas from penetrating into the nozzles 420 and 430, the valves 524 and 534 may be opened to allow a $N_2$ gas to flow into the gas supply pipes 520 and 530.

At this time, the APC valve 243 is adjusted so that the internal pressure of the process chamber 201 is set to a pressure within the range of, for example, 1 to 3,990 Pa. The supply flow rate of the metal-containing gas controlled by the MFC 312 is set to a flow rate within the range of, for example, 0.1 to 2.0 slm. In the following, the temperature of the heater 207 is set to a temperature such that the temperature of the wafer 200 is a temperature within the range of, for example, 300 to 550 degrees C. The time for supplying the metal-containing gas to the wafer 200 is set to a time within the range of, for example, 0.01 to 30 seconds.

Figure 5B:
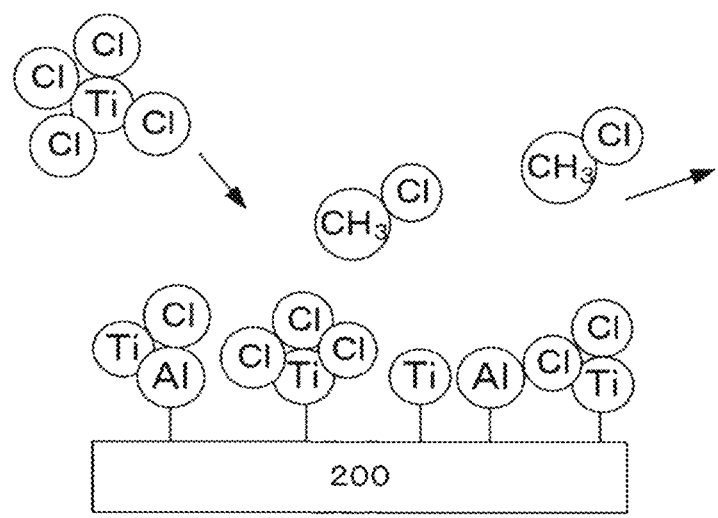

In this operation, the metal-containing gas is supplied to the wafer 200 on which the methyl group, which is the organic ligand derived from the organic ligand-containing gas, is adsorbed, that is, the wafer 200 whose surface is terminated with the methyl group. Here, as the metal-containing gas, it may be possible to use, e.g., a titanium tetrachloride ($TiCl_4$) gas containing titanium (Ti) and halogen (chlorine). When the $TiCl_4$ gas is used as the metal-containing gas, the result is as shown in FIG. 5A. That is, the $TiCl_4$ gas is supplied to the wafer 200 on which the methyl group, which is the organic ligand, is exposed. By supplying the $TiCl_4$ gas, as shown in FIG. 5B, halogen (Cl) contained in the $TiCl_4$ gas reacts with the methyl group existing on the wafer 200 to adsorb $TiCl_x$ (x is smaller than 4) on the wafer 200. That is, since $TiCl_x$ having a molecular size smaller than that of $TiCl_4$ is adsorbed on the wafer 200, steric hindrance is reduced as compared with the case where $TiCl_4$ is adsorbed. That is, since $TiCl_x$ having a smaller molecular size is adsorbed on the wafer 200 (the base film on the surface of the wafer 200) to increase the adsorption density of a Ti element on the wafer 200, a Ti-containing layer having the high Ti element content can be formed. At this time, chloromethane ($CH_3Cl$) is produced as a by-product. Most of this by-product is desorbed from the wafer 200.

(Purging: Second Step)

After the lapse of a predetermined time from the start of the supply of the metal-containing gas, for example, 0.1 to 10 seconds later, the valve 314 is closed to stop the supply of the metal-containing gas. At this time, with the APC valve 243 of the exhaust pipe 231 left open, the interior of the process chamber 201 is vacuum-exhausted by the vacuum pump 246 to remove a residual gas from the wafer 200 so that the unreacted metal-containing gas and reaction by-products remaining in the process chamber 201 are excluded from the interior of the process chamber 201. At this time, the valves 514, 524, 534 are kept open to maintain the supply of the inert gas as the purge gas into the process chamber 201. The inert gas can act as the purge gas to remove the residual gas from the wafer 200, thereby enhancing the effect of excluding the unreacted metal-containing gas and reaction by-products remaining in the process chamber 201 from the interior of the process chamber 201. The supply flow rates of the inert gases controlled by the MFC 512, 522, and 532 are set to, for example, 0.1 to 10 slm, respectively.

(First Reducing Gas Supply: Third Step)

After the lapse of a predetermined time from the start of purging, for example, 0.1 to 10 seconds later, the valves 514, 524, and 534 are closed to stop the supply of the inert gas into the process chamber 201. At this time, the valve 334 is opened to allow a first reducing gas to flow into the gas supply pipe 330. The first reducing gas is also referred to as a nitrogen-containing gas. The flow rate of the first reducing gas is adjusted by the MFC 332, and the first reducing gas is supplied into the process chamber 201 from the gas supply hole 430a of the nozzle 430 and is exhausted through the exhaust pipe 231. In this operation, the first reducing gas is supplied to the wafer 200. At the same time, the valve 534 may be opened to allow an inert gas to flow into the gas supply pipe 530. Further, in order to prevent the first reducing gas from penetrating from the nozzles 410 and 420, the valves 514 and 524 may be opened to allow an inert gas to flow into the gas supply pipes 510 and 520.

At this time, the APC valve 243 is adjusted so that the internal pressure of the process chamber 201 is set to a pressure within the range of, for example, 1 to 3,990 Pa. The supply flow rate of the first reducing gas controlled by the MFC 332 is set to a flow rate within the range of, for example, 0.1 to 30 slm. The time for supplying the first reducing gas to the wafer 200 is set to a time within the range of, for example, 0.01 to 30 seconds.

Figure 5C:
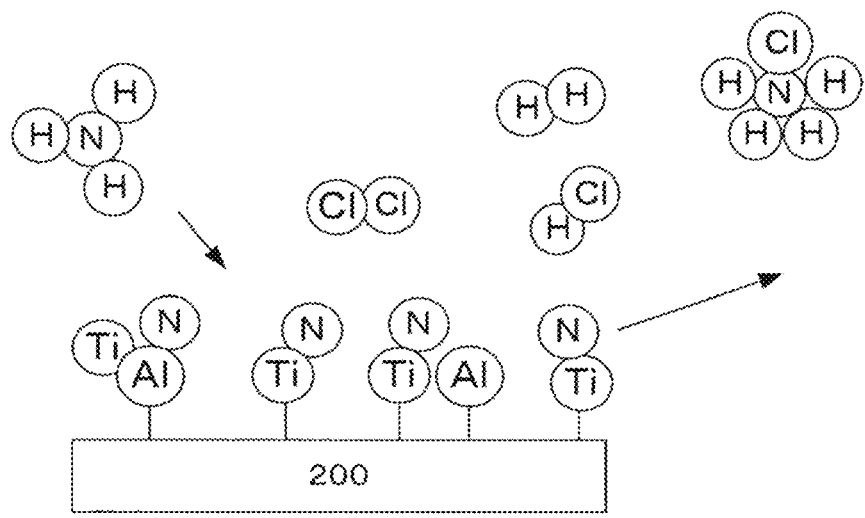

In this operation, the first reducing gas is supplied to the wafer. Here, as the first reducing gas, it may be possible to use, e.g., an ammonia ($NH_3$) gas as a N-containing gas containing nitrogen (N). A reaction when the $NH_3$ gas is used as the first reducing gas is shown in FIG. 5C. As shown in FIG. 5C, the NH$_3$ gas undergoes a substitution reaction with at least a portion of the Ti-containing layer formed on the wafer 200. At the time of the substitution reaction, Ti contained in the Ti-containing layer and N contained in the NH$_3$ gas are bonded to form a TiN layer on the wafer 200. In addition, reaction by-products such as HCl, NH$_4$Cl, and H$_2$ are produced at the time of the substitution reaction.

(Purging: Fourth Step)

After the lapse of a predetermined time from the start of the supply of the first reducing gas, for example, 0.01 to 60 seconds later, the valve 334 is closed to stop the supply of the first reducing gas. At this time, with the APC valve 243 of the exhaust pipe 231 left open, the interior of the process chamber 201 is vacuum-exhausted by the vacuum pump 246 to remove a residual gas from the wafer 200 so that the unreacted first reducing gas or the first reducing gas after contributing to the formation of the metal-containing layer and reaction by-products remaining in the process chamber 201 are excluded from the process chamber 201. At this time, the valves 514, 524, and 534 are kept open to maintain the supply of the inert gas as the purge gas into the process chamber 201. The inert gas can act as the purge gas to remove the residual gas from the wafer 200, thereby enhancing the effect of excluding the unreacted first reducing gas and the reaction by-products remaining in the process chamber 201 from the interior of the process chamber 201. The supply flow rates of the inert gases controlled by the MFC 512, 522, and 532 are set to, for example, 0.1 to 10 slm, respectively.

That is, the unreacted first reducing gas or the first reducing gas after contributing to the formation of the metal-containing layer and the reaction by-products remaining in the process chamber 201 are excluded from the interior of the process chamber 201. The inert gas acts as the purge gas.

(Performing Predetermined Number of Times)

By performing a cycle a predetermined number of times (N times) (one or more times), the cycle including sequentially performing the described-above first to fourth steps, a metal-containing layer having a predetermined thickness is formed on the wafer 200 to form a metal-containing film. Here, a TiN film is formed as the metal-containing film.

(After-Purging and Returning to Atmospheric Pressure)

An inert gas is supplied into the process chamber 201 from each of the gas supply pipes 510 to 530 and is exhausted through the exhaust pipe 231. The inert gas acts as a purge gas, whereby the interior of the process chamber 201 is purged with the inert gas to remove a gas and reaction by-products remaining in the process chamber 201 from the process chamber 201 (after-purge). After that, the internal atmosphere of the process chamber 201 is substituted with the inert gas (inert gas substitution), and the internal pressure of the process chamber 201 is returned to the atmospheric pressure (returning to atmospheric pressure).

(Wafer Unloading)

After that, the seal cap 219 is moved down by the boat elevator 115 to open the lower end of the outer tube 203. Then, the processed wafers 200 supported by the boat 217 are unloaded from the lower end of the outer tube 203 to the outside of the outer tube 203 (boat unloading). After that, the processed wafers 200 are discharged from the boat 217 (wafer discharging).

Figure 6A:
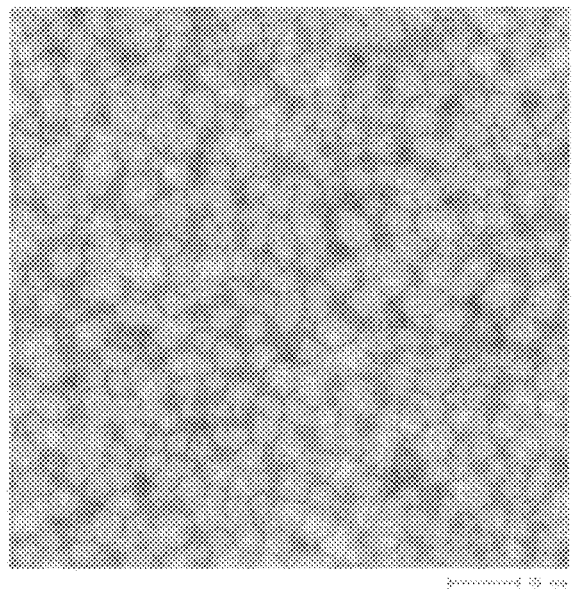
FIG. 6A is a view showing a TEM image of the surface of a TiN film formed on a substrate by using the substrate-processing sequence shown in FIG. 4.
Figure 6B:
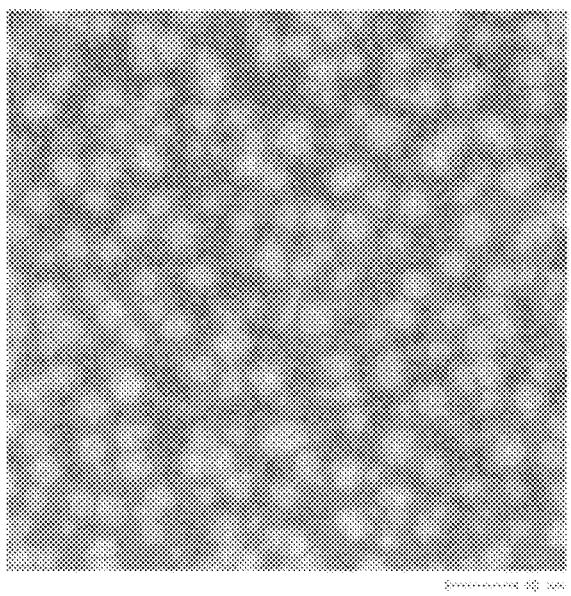
FIG. 6B is a view showing a TEM image of the surface of a TiN film formed on a substrate by using a substrate-processing sequence according to a comparative example.

FIG. 6A is a view showing a TEM image obtained by using a transmission electron microscope (TEM) projecting a TiN film formed on a wafer 200 using the above-described substrate-processing sequence. FIG. 6B is a view showing a TEM image of the surface of the TiN film formed on the wafer 200 by using a substrate-processing sequence according to a comparative example. Under the same conditions, a TiN film having a film thickness of 20 Å was formed on the wafer 200 on which a silicon oxide (SiO$_2$) film was formed.

In the substrate-processing sequence according to the comparative example, the above-described pre-process was not performed before the film-forming process was performed to the wafer 200. When the TiN film formed by the substrate-processing sequence according to the comparative example and formed without supplying a gas containing an organic ligand is formed on the SiO$_2$ film, it grew as an island shape in a thin film of about 20 Å, without becoming a continuous film, as shown in FIG. 6B. That is, the adsorption of TiCl$_4$ onto the wafer 200 was insufficient, resulting in poor coverage.

In contrast, as shown in FIG. 6A, the TiN film formed by the substrate-processing sequence in the present embodiments was formed continuously with smaller crystal grains and higher density than the TiN film formed by the substrate-processing sequence according to the comparative example, resulting high coverage.

That is, by supplying the gas containing the organic ligand before the film-forming process, it was confirmed that the adsorption of TiCl$_4$ onto the wafer 200 can be promoted and thus the adsorption density of the Ti element can be increased, so that a TiN film having the high content of the Ti element can be formed. That is, it was confirmed that it was possible to reduce the resistance of a W film formed on the surface of the TiN film.

(3) Effects of the Present Embodiments

According to the present embodiments, one or more effects set forth below may be achieved. (a) The characteristics of the metal-containing film can be improved. (b) The metal-containing film can be continuously grown. Here, "continuous" means that the crystals of the material of the metal-containing film are continuous, the crystal spacing is small, etc. (c) A metal-containing film having high density and flatness can be formed. (d) The coverage can be improved, and the resistivity of other metal-containing films formed on the metal-containing film can be reduced. (e) It is possible to increase the adsorption density of the metal element in the metal-containing gas.

(4) Other Embodiments

The embodiments of the present disclosure have been specifically described above. However, the present disclosure is not limited to the above-described embodiments, and various modifications can be made without departing from the gist thereof.

In the above embodiments, as the pre-process, the example in which the organic ligand-containing gas is continuously supplied has been described, but the present disclosure is not limited thereto, but may be applied to a case where different gases are used.

Modification 1

Figure 7:
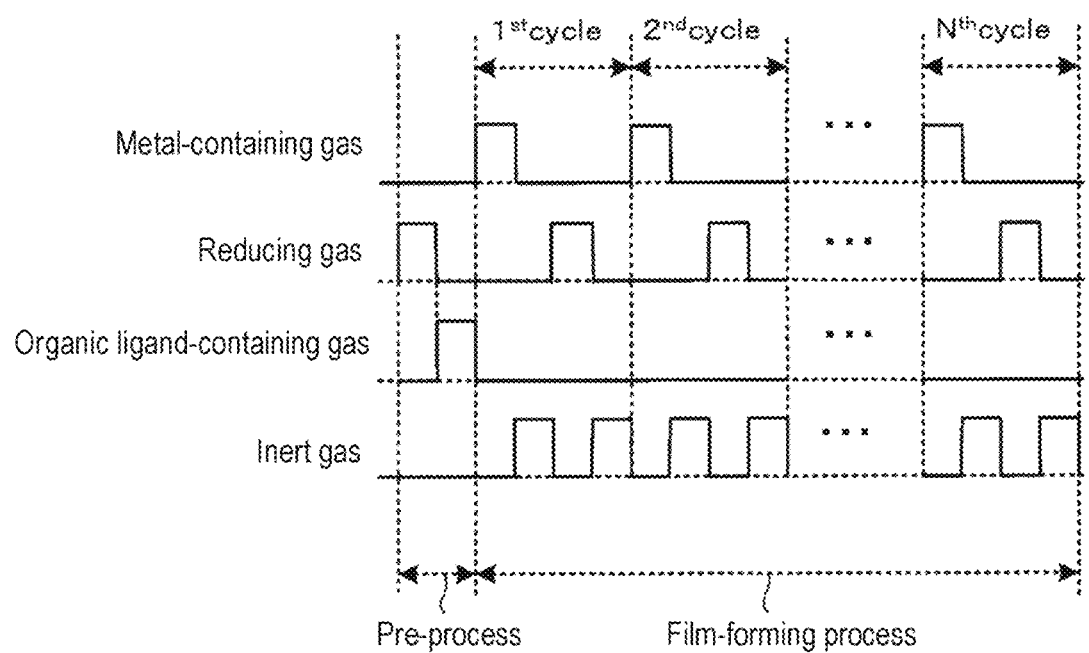
FIG. 7 is a diagram showing a modification of the substrate-processing sequence according to the embodiments of the present disclosure.

FIG. 7 shows a modification of the substrate-processing sequence according to the embodiments of the present disclosure. In this modification, as the pre-process, a second reducing gas is supplied before the organic ligand-containing gas is supplied. That is, before performing the film-forming process, as the pre-process, a step of supplying the second reducing gas to the wafer 200 and a step of supplying an organic ligand-containing gas are performed. At this time, a purge gas is not supplied between the second reducing gas supply and the organic ligand-containing gas supply and between the pre-process and the film-forming process. Even in this case, the same effects as the above-described substrate-processing sequence shown in FIG. 4 can be obtained. In this modification, the same type of gas is used for the first reducing gas and the second reducing gas.

As shown in this modification, by supplying the second reducing gas (for example, an $NH_3$ gas) to the wafer 200 before supplying the organic ligand-containing gas (for example, a TMA gas) to the wafer 200 in the pre-process, at least one selected from the group of a NH bond (NH termination) and a H bond (H termination) can be formed on the wafer 200. When any one of these bonds occurs, the amount of the organic ligand-containing gas adsorbed on the wafer 200 can be increased. As a result, the amount of a methyl group, which is an organic ligand, adsorbed on the wafer 200 is increased, and the metal-containing gas is supplied to the wafer 200 on which the methyl group, which is the organic ligand, is adsorbed. That is, the metal-containing gas is supplied to the wafer 200 on which the methyl group, which is the organic ligand, is exposed. Here, when the metal-containing gas is a $TiCl_4$ gas, by supplying the $TiCl_4$ gas, halogen (Cl) contained in the $TiCl_4$ gas reacts with the methyl group existing on the wafer 200 to adsorb a $TiCl_x$ (x is smaller than 4) on the wafer 200. That is, as compared to the case where $TiCl_4$ is adsorbed, $TiCl_x$ with less steric hindrance is adsorbed on the wafer 200 (the base film on the surface), so that the adsorption density of the Ti element on the wafer 200 can be increased, thereby forming a Ti-containing layer having the high content of the Ti element. Further, as the second reducing gas in the pre-process, by using the same $NH_3$ gas as the first reducing gas in the film-forming process, the number of gas supply pipes connected to the process container can be reduced.

Modification 2

FIG. 8 shows another modification of the substrate-processing sequence according to the embodiments of the present disclosure. In this modification, as the pre-process, a second reducing gas is supplied before and after supplying the organic ligand-containing gas, and the organic ligand-containing gas and the second reducing gas are supplied one or more times, respectively. After that, the above-described film-forming process is performed. That is, before performing the film-forming process, as the pre-process, after performing a step of supplying the second reducing gas to the wafer 200, a step of supplying the organic ligand-containing gas and a step of supplying the second reducing gas are performed a predetermined number of times (M times) (one or more times). At this time, a purge gas is not supplied between the second reducing gas supply and the organic ligand-containing gas supply and between the pre-process and the film-forming process. Even in this case, the same effects as the above-described substrate-processing sequence shown in FIG. 4 can be obtained.

Figure 9A:
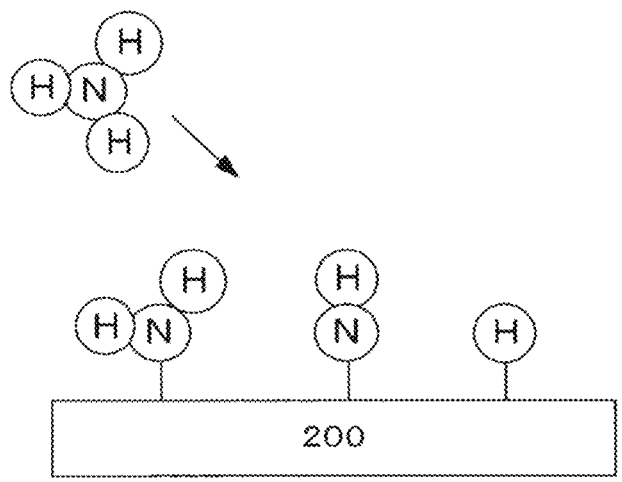
FIGS. 9A to 9D are schematic views for explaining the state of a substrate surface in the substrate-processing sequence shown in FIG. 8.

In this modification, as shown in FIG. 9A, by supplying an $NH_3$ gas as the second reducing gas before supplying a TMA gas as the organic ligand-containing gas to the wafer 200 in the pre-process, at least one selected from the group of a NH bond (NH termination) and a H bond (H termination) can be formed on the wafer 200. By forming the NH termination or H termination, the amount of adsorption of molecules (TMA) of the organic ligand-containing gas on the wafer 200 can be increased. That is, the number of organic ligands on the wafer 200 can be increased.

Figure 9B:
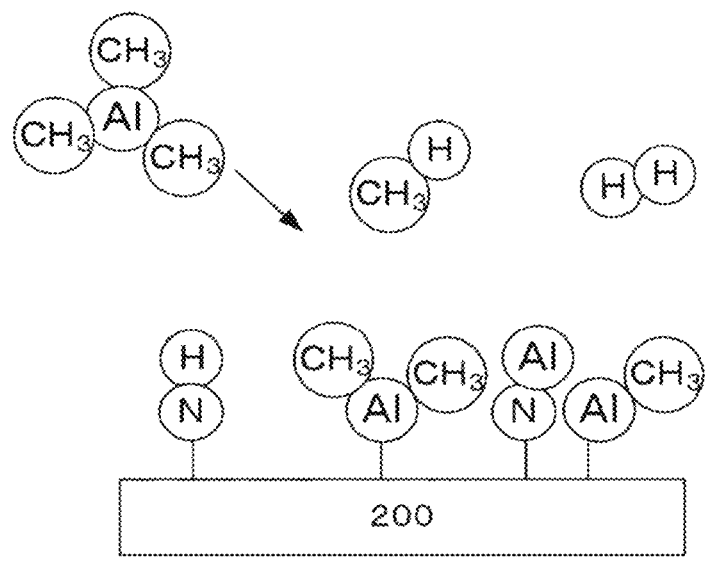
Figure 9C:
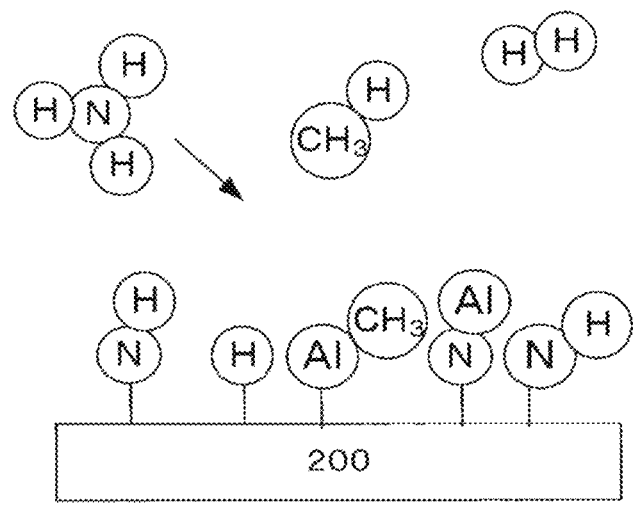

Then, as shown in FIGS. 9B and 9C, an $NH_3$ gas is supplied to the wafer 200 on which TMA is adsorbed. As a result, at least one selected from the group of a NH bond (NH termination) and a H bond (H termination) is formed at the dangling site on the wafer 200. Further, $NH_3$ can react with a part of organic ligands formed on the wafer 200 to remove a part of organic ligands (for example, remove $CH_3$) from $Al—(CH_3)_x$, thereby producing an organic ligand having a small number of molecules, for example, a ligand such as $Al—(CH_3)_y$. Here, y is smaller than x. For example, x=2 and y=1. A part thereof becomes AlN by a reaction between TMA and $NH_3$.

As shown in this modification, in the pre-process, after performing the step of supplying the $NH_3$ gas to the wafer 200, by performing the step of supplying the TMA gas and the step of supplying the $NH_3$ gas a predetermined number of times (M times) (one or more times), the number of organic ligands, NH bonds, and H bonds on the wafer 200 can be increased. In addition, an organic ligand having a small number of molecules can be produced. Here, the organic ligand having a small number of molecules is also referred to as a low molecule organic ligand, and specifically, it is a ligand having 3 or less hydrocarbon groups (CH—), preferably a ligand having 2 or less hydrocarbon groups.

Figure 9D:
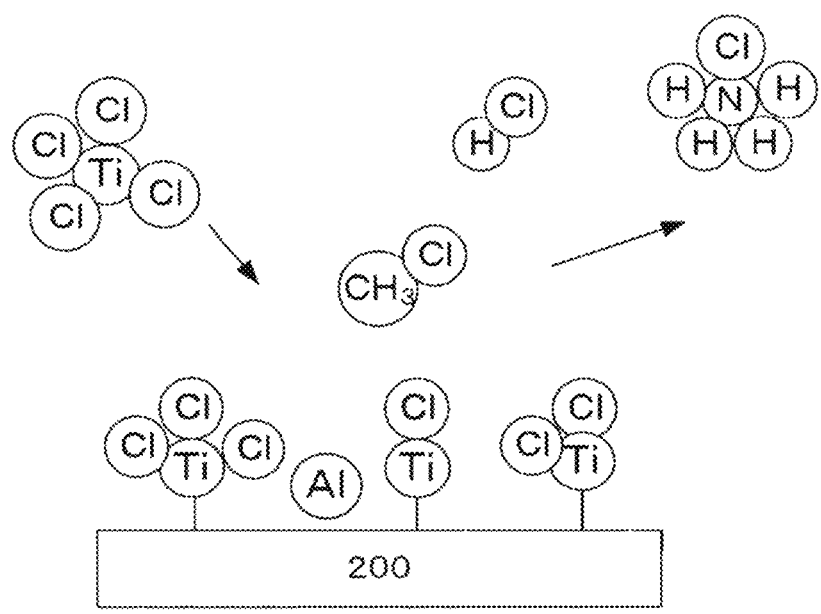

Then, by supplying a $TiCl_4$ gas to the wafer 200 in such a surface state, as shown in FIG. 9D, Cl contained in the $TiCl_4$ gas and the NH bond or organic ligand existing on the wafer 200 react with each other to adsorb $TiCl_x$ (x is smaller than 4) with Cl reduced from $TiCl_4$ on the wafer 200. Therefore, $TiCl_x$ with less steric hindrance is formed on the wafer 200 (the base film on the surface of the wafer 200) than a case where $TiCl_4$ is adsorbed, so that the adsorption density of the Ti element on the wafer 200 can be increased, thereby forming a Ti-containing layer having the high content of Ti element. Further, as the second reducing gas in the pre-process, by using the same $NH_3$ gas as the first reducing gas in the film-forming process, the number of gas supply pipes connected to the process container can be reduced. Further, here, since the organic ligand having a small number of molecules is produced on the wafer 200, it is possible to prevent the organic ligand itself from becoming steric hindrance, and thus it is possible to promote the adsorption of $TiCl_x$.

Modification 3

Figure 10:
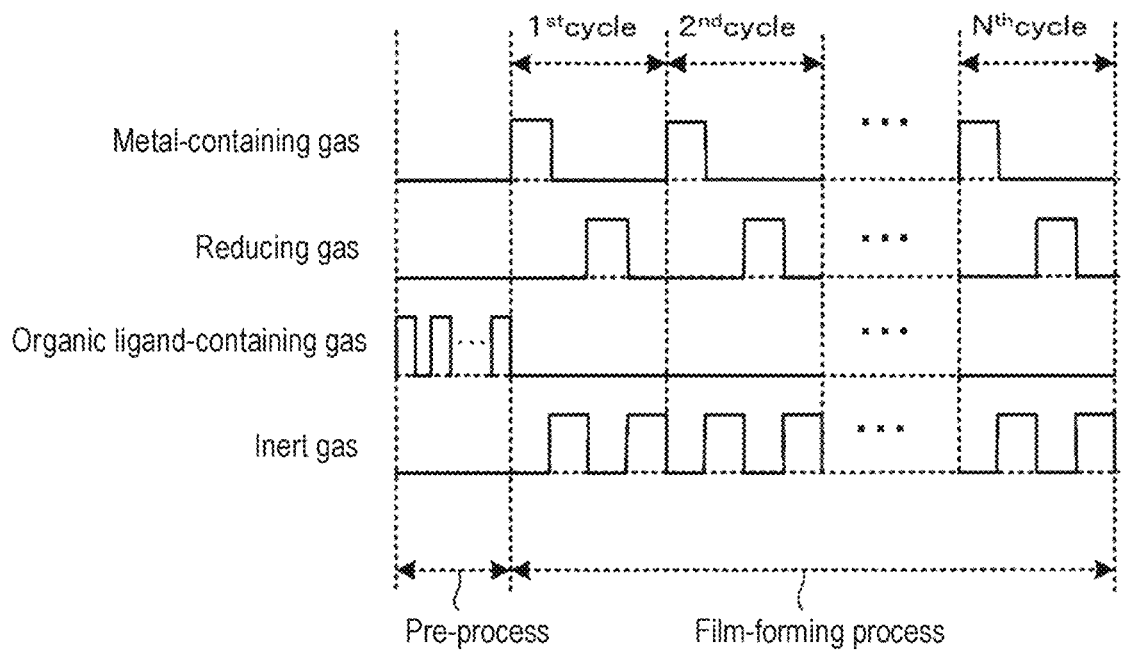
FIG. 10 is a diagram showing a modification of the substrate-processing sequence according to the embodiments of the present disclosure.

FIG. 10 shows another modification of the substrate-processing sequence according to the embodiments of the present disclosure. In this modification, in the pre-process, the organic ligand-containing gas is supplied in a time-division manner. That is, as the pre-process, after the organic ligand-containing gas is supplied in the time-division manner, the above-described film-forming process is performed without supplying a purge gas. By separately supplying the organic ligand-containing gas, the organic ligand can be adsorbed on the wafer 200 without any gap. Even in this case, the same effects as the above-described substrate-processing sequence shown in FIG. 4 can be obtained.

Modification 4

Figure 11:
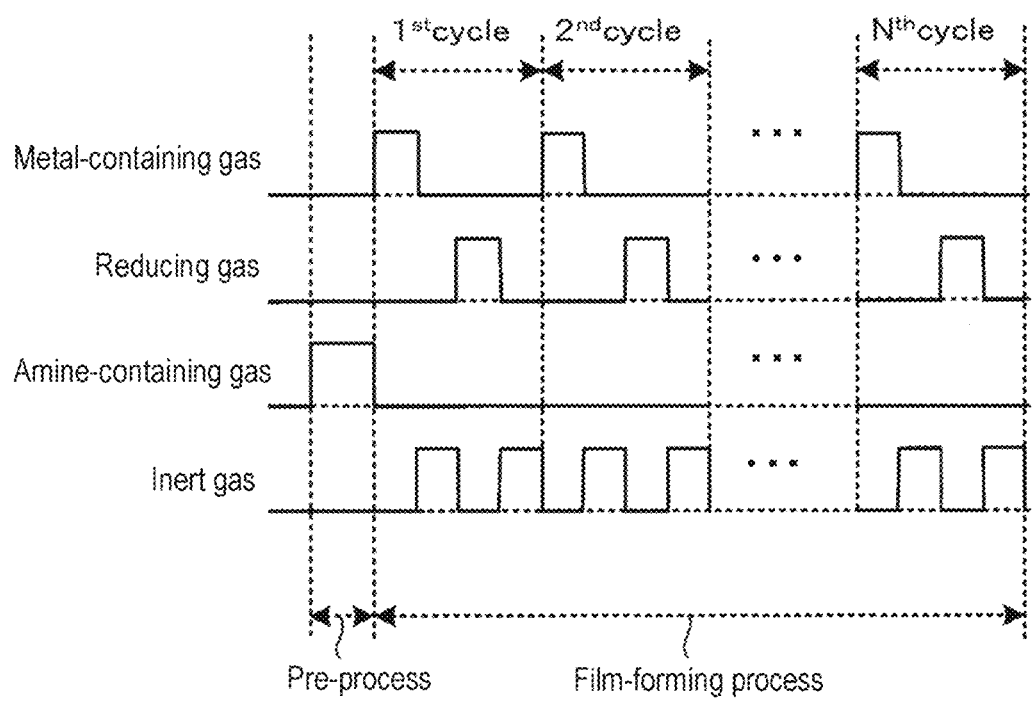
FIG. 11 is a diagram showing a modification of the substrate-processing sequence according to the embodiments of the present disclosure.

FIG. 11 shows another modification of the substrate-processing sequence according to the embodiments of the present disclosure. In this modification, in the pre-process, an amine-containing organic ligand gas (also simply referred to as an amine-containing gas in the present disclosure) is supplied as the organic ligand-containing gas. The amine-containing gas supplies a gas containing an organic ligand having an amine group (NH—), for example, a tridimethylaminosilane (((CH$_3$)$_2$N)$_3$SiH) gas (hereinafter referred to as a TDMAS gas). After supplying the amine-containing gas as the pre-process, the above-described film-forming process is performed without supplying a purge gas. Even in this case, the same effects as the above-described substrate-processing sequence shown in FIG. 4 can be obtained.

In this modification, in the pre-process, by using a gas containing an organic ligand having an amine group as the gas containing an organic ligand, a NH bond which is an amine group on the wafer 200 can be increased. Then, a TiCl$_4$ gas is supplied to the wafer 200 on which the NH bond is adsorbed. By supplying the TiCl$_4$ gas, Cl contained in the TiCl$_4$ gas reacts with the NH bond (NH termination) existing on the wafer 200 to adsorb TiCl$_x$ (x is smaller than 4) on the wafer 200. That is, TiCl$_x$ having a smaller number of molecules and less steric hindrance than TiCl$_4$ is formed on the wafer 200 (the base film on the surface of the wafer 200), thereby forming a continuous TiN film having a large amount of adsorption of Ti. As for the gas containing an organic ligand, a small molecule material is preferable because an organic ligand functions as steric hindrance in the case of a polymer material.

Further, as the organic ligand-containing gas, there are materials containing an IVA group element such as Si. Among these materials, in a material in which an IVA group element and a hydrocarbon (CH—) group are directly bonded to each other, the bonding energy between the hydrocarbon (CH—) group and the IVA group element is considered to be larger than the bonding energy between the metal element (non-transition metal element) as described above and the hydrocarbon group, which may make it difficult to obtain the effects as described in the present disclosure. For example, since the bond between Si and CH$_3$ is not easily broken in an organic ligand such as —Si—(CH$_3$)$_x$, it is considered that even when the TiCl$_4$ gas is supplied, it will not react with —Si—(CH$_3$)$_x$. Therefore, as the gas containing an organic ligand, a gas containing the metal element as described above is preferable. More preferably, a gas containing an organic ligand containing the non-transition metal element as described above is used. That is, by using a gas containing an organic ligand containing a metal element (non-transition metal element), it is possible to further obtain the above-described effects. Further, it is preferable that the metal element is not transition metal but non-transition metal. When a gas containing an element such as Hf or Zr is used as the transition metal, it is conceivable that a dielectric having a high dielectric constant is formed in the pre-process. When such a dielectric is formed, it may affect the characteristics of the semiconductor device. Further, with a transition metal such as Ti, the following effects can be considered.

Further, in the above embodiments, the metal element contained in the gas containing the organic ligand used in the pre-process and the metal element contained in the metal-containing gas in the film-forming process are different from each other. By using the gases containing the different metal elements, it is possible to prevent the metal-containing film formed in the film-forming process from being affected by the characteristics of the metal-containing layer formed in the pre-process. For example, if a gas containing Ti similar to that in the film-forming process is used in the pre-process, it is conceivable that a TiN film having poor characteristics is formed and the characteristics of the TiN film formed in the film-forming process are deteriorated. Therefore, it is preferable that the metal elements contained in the gases used in the film-forming process and the pre-process are different from each other.

Further, in the above embodiments, the case where the same NH$_3$ gas is used for the second reducing gas used in the pre-process and the first reducing gas used in the film-forming process has been described, but the present disclosure is limited thereto. For example, different gases may be used for the second reducing gas used in the pre-process and the first reducing gas used in the film-forming process.

Further, in the above embodiments, the embodiments in which a purging step is not performed between the pre-process and the film-forming process have been described, but the present disclosure is not limited thereto. For example, a purging step may be appropriately performed between the pre-process and the film-forming process. By performing the purging step between the pre-process and the film-forming process, by-products and excess gases existing in the process chamber 201 can be removed, thereby improving the characteristics of the film formed in the film-forming process.

Modification 5

Figure 4:
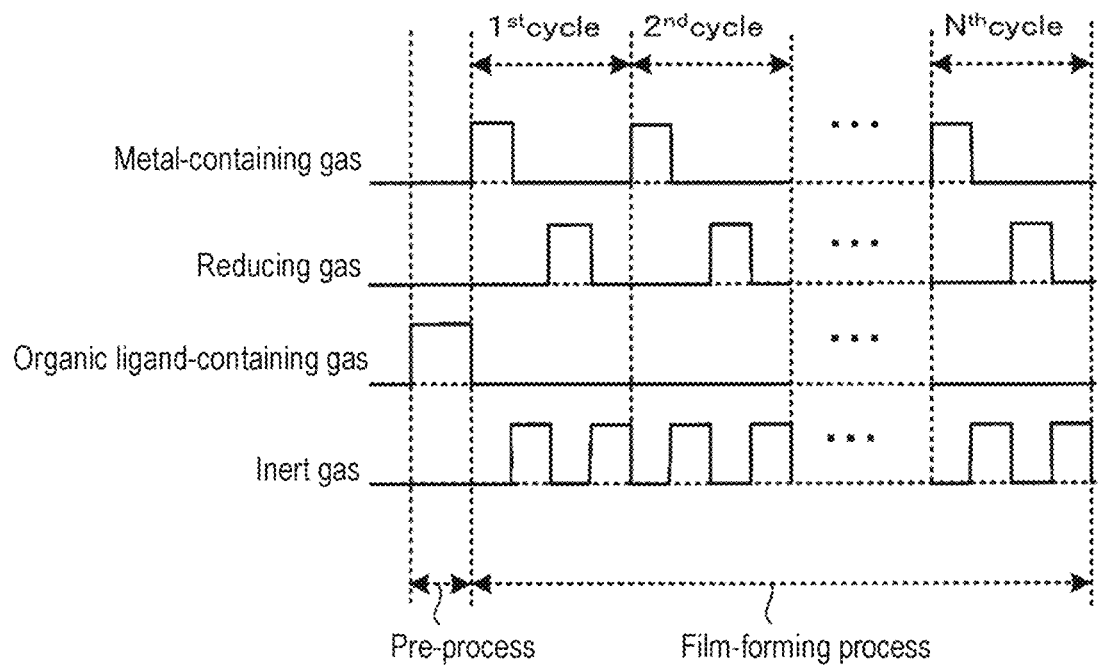
FIG. 4 is a diagram showing a substrate-processing sequence according to the embodiments of the present disclosure.
Figure 12:
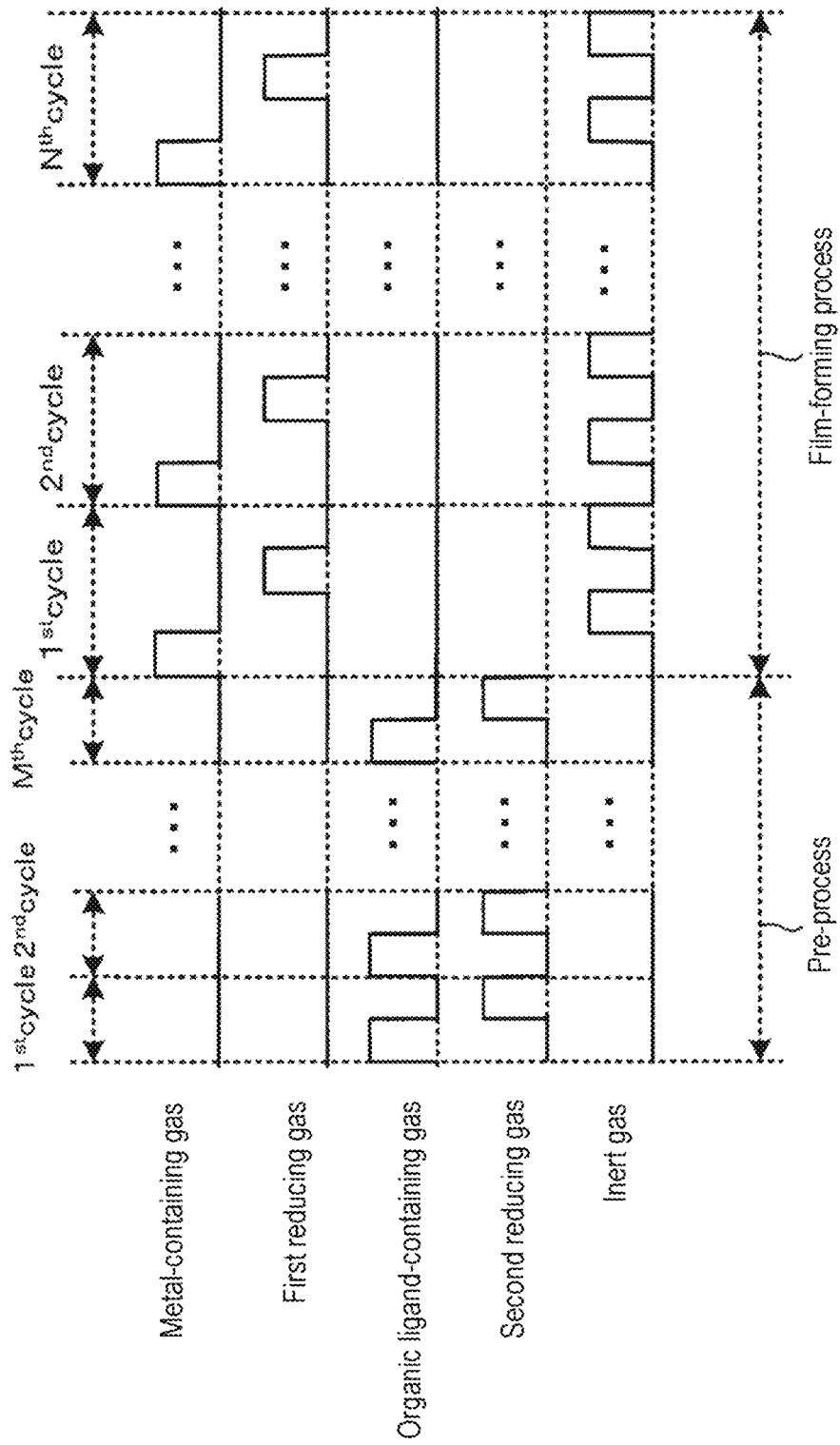
FIG. 12 is a diagram showing a modification of the substrate-processing sequence according to the embodiments of the present disclosure.

For example, as shown in FIG. 12, in a case of forming a Mo film as a metal-containing film on the wafer 200 by performing, as the pre-process, a step of supplying an organic ligand-containing gas and a step of supplying a second reducing gas one or more times, respectively, and then preforming, as the film-forming process, a step of supplying a molybdenum dichloride dioxide (MoO$_2$Cl$_2$) gas as a metal-containing gas and a step of supplying a hydrogen (H$_2$) gas as a first reducing gas one or more times, respectively, the same effects as the above-described substrate-processing sequence shown in FIG. 4 can be obtained.

Further, in the above embodiments, the case where the TMA gas, which is a gas containing a hydrocarbon group, an alkyl group, and a methyl group, is used for the gas containing an organic ligand in the pre-process has been described, but the present disclosure is not limited thereto. The present disclosure can be suitably applied to even a case where a gas containing at least one selected from the group of an ethyl group, a propyl group, a butyl group, an isopropyl group, and an isobutyl group, which are alkyl groups, is used for the gas containing an organic ligand.

Further, in the above embodiments, the case where the TiCl$_4$ gas containing Ti and Cl is used as the metal-containing gas has been described, but the present disclosure is not limited thereto. The present disclosure can be suitably applied to even a case where a gas containing molybdenum (Mo), ruthenium (Ru), copper (Cu), or tungsten (W) and halogen is used as the metal-containing gas.

Further, in the above embodiments, the case where the TiN film is formed as the metal-containing film has been described, but the present disclosure is not limited thereto. The present disclosure can be suitably applied to even a case where a Mo film, a Ru film, a Cu film, a W film, a titanium silicide nitride (TiSiN) film, or the like is formed as the metal-containing film.

Further, in the above-described embodiments, the example in which a film is formed by using the substrate processing apparatus which is a batch-type vertical apparatus capable of processing a plurality of substrates at a time has been described, but the present disclosure is not limited thereto. For example, the present disclosure can be suitably applied to even a case where a film is formed by using a single-wafer type substrate processing apparatus capable of processing a single substrate or several substrates at a time.

Figure 13A:
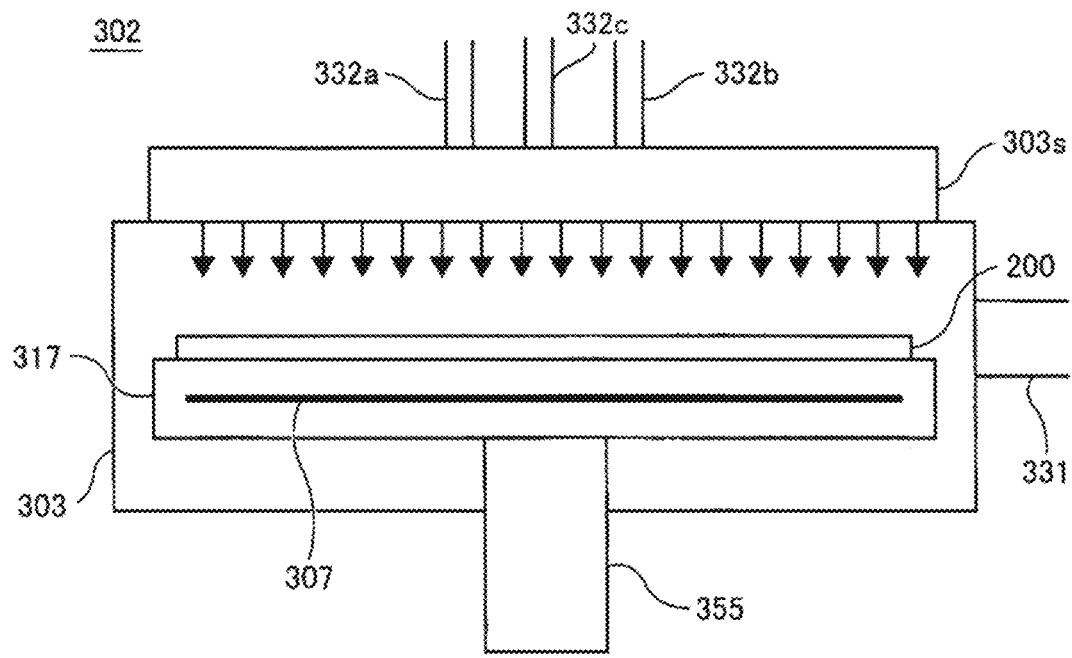
FIGS. 13A and 13B are longitudinal sectional views showing the outline of a process furnace of a substrate processing apparatus according to other embodiments of the present disclosure.

For example, the present disclosure can be suitably applied to even a case where a film is formed by using a substrate processing apparatus including a process furnace 302 shown in FIG. 13A. The process furnace 302 includes a process container 303 forming a process chamber 301, a shower head 303s that supplies a gas into the process chamber 301 in a shower shape, a support 317 that supports one or several wafers 200 in a horizontal posture, a rotary shaft 355 that supports the support 317 from below, and a heater 307 installed in the support 317. A gas supply port 332a that supplies the above-described metal-containing gas, a gas supply port 332b that supplies the above-described reducing gas, and a gas supply port 332c that supplies the above-described organic ligand-containing gas are connected to an inlet (gas introduction port) of the shower head 303s. A metal-containing gas supply system similar to the metal-containing gas supply system of the above-described embodiments is connected to the gas supply port 332a. A reducing gas supply system similar to the reducing gas supply system of the above-described embodiments is connected to the gas supply port 332b. A gas supply system similar to the above-mentioned organic ligand-containing gas supply system is connected to the gas supply port 332c. A gas dispersion plate that supplies a gas into the process chamber 301 in a shower shape is installed in an outlet (gas discharge port) of the shower head 303s. An exhaust port 331 that exhausts the interior of the process chamber 301 is installed in the process container 303. An exhaust system similar to the exhaust system of the above-described embodiments is connected to the exhaust port 331.

Figure 13B:
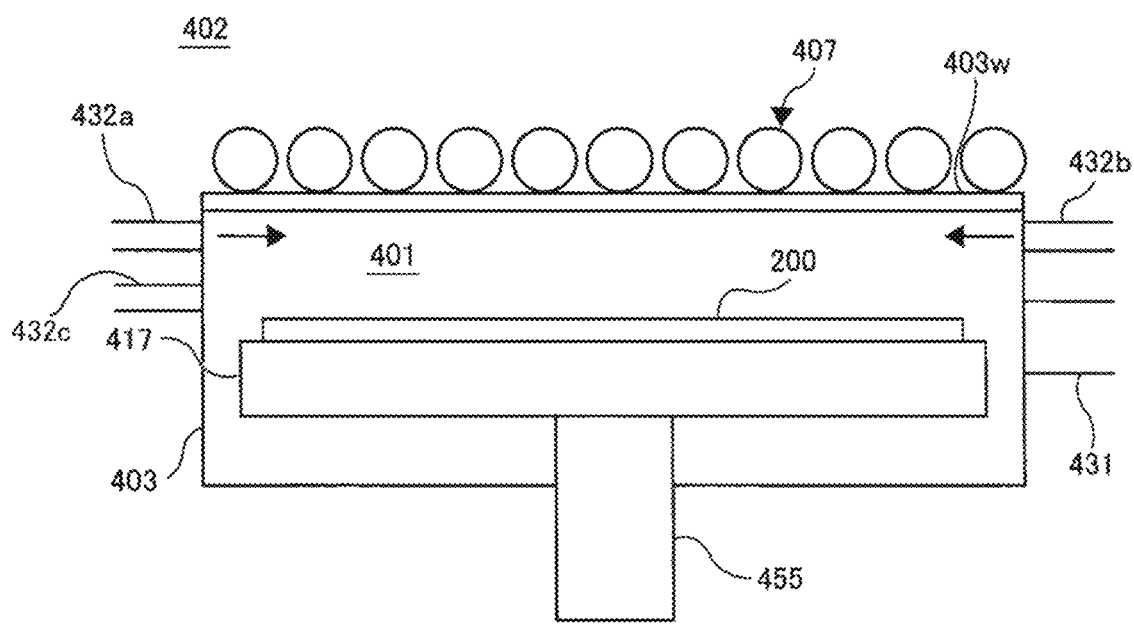

Further, for example, the present disclosure can be suitably applied to even a case where a film is formed by using a substrate processing apparatus including a process furnace 402 shown in FIG. 13B. The process furnace 402 includes a process container 403 forming a process chamber 401, a support 417 that supports one or several wafers 200 in a horizontal posture, a rotary shaft 455 that supports the support 417 from below, a lamp heater 407 that irradiates the wafers 200 of the process container 403 with light, and a quartz window 403w that transmits the light of the lamp heater 407. A gas supply port 432a that supplies the above-described metal-containing gas, a gas supply port 432b that supplies the above-described reducing gas, and a gas supply port 432c that supplies the above-described organic ligand-containing gas are connected to the process container 403. A metal-containing gas supply system similar to the metal-containing gas supply system of the above-described embodiments is connected to the gas supply port 432a. A reducing gas supply system similar to the reducing gas supply system of the above-described embodiments is connected to the gas supply port 432b. A gas supply system similar to the organic ligand-containing gas supply system of the above-described embodiments is connected to the gas supply port 432c. An exhaust port 431 that exhausts the interior of the process chamber 401 is installed in the process container 403. An exhaust system similar to the exhaust system of the above-described embodiments is connected to the exhaust port 431.

Even when these substrate processing apparatuses are used, a film can be formed under the same sequence and process conditions as those in the above-described embodiments.

It is preferable that a process recipe (a program in which the processing procedure, process conditions, and the like are written) used for forming these various types of thin films is prepared individually (in plural) according to the substrate-processing contents (film type, composition ratio, film quality, film thickness, processing procedure, process conditions, and the like of a thin film to be formed). Then, when starting the substrate processing, it is preferable that an appropriate process recipe is appropriately selected from a plurality of process recipes according to the contents of the substrate processing. Specifically, it is preferable that the plurality of process recipes individually prepared according to the contents of the substrate processing are stored (installed) in advance in the memory 121c included in the substrate processing apparatus via a telecommunication line or a recording medium (the external memory 123) on which the process recipes are recorded. Then, when starting the substrate processing, it is preferable that the CPU 121a included in the substrate processing apparatus appropriately selects an appropriate process recipe from the plurality of process recipes stored in the memory 121c according to the contents of the substrate processing. With this configuration, it is possible to form thin films of various film types, composition ratios, film qualities, and film thicknesses with a single substrate processing apparatus in a versatile and well-reproducible manner. Further, it is possible to reduce an operator's operation burden (input burden of processing procedure, process conditions, etc.) and to quickly start the substrate processing while avoiding an operation error.

Further, the present disclosure can also be realized by, for example, changing a process recipe of the existing substrate processing apparatus. When changing a process recipe, the process recipe according to the present disclosure may be installed on the existing substrate processing apparatus via a telecommunications line or a recording medium on which the process recipe is recorded, or it is also possible to change a process recipe of the existing substrate processing apparatus to the process recipe according to the present disclosure by operating an input/output device of the existing substrate processing apparatus.

Further, the present disclosure can be used for, for example, a word line portion of a NAND flash memory or DRAM having a three-dimensional structure.

Although various typical embodiments of the present disclosure have been described above, the present disclosure is not limited to those embodiments, and such embodiments may be used in proper combination.

Hereinafter, Examples will be described.

Example 1

By using the above-described substrate processing apparatus 10, Sample 1 in which a TiN film having a thickness of 20 Å was formed on a $SiO_2$ substrate according to the above-described substrate-processing sequence of FIG. 4, Sample 2 in which a TiN film having a thickness of 20 Å was formed on a $SiO_2$ substrate according to the above-described substrate-processing sequence of FIG. 7, Sample 3 in which a TiN film having a thickness of 20 Å was formed on a $SiO_2$ substrate according to the above-described substrate-processing sequence of FIG. 8, and Sample 4 in which a TiN film having a thickness of 20 Å was formed on a $SiO_2$ substrate according to a substrate-processing sequence not performed with the pre-process before the film-forming process were prepared. FIG. 14 is a view showing TEM images obtained by projecting the surfaces of the TiN films of Samples 1 to 4 by using a transmission electron microscope (TEM).

As shown in FIG. 14, it was confirmed that the TiN films of Samples 1 to 3 had the higher particle ratio and higher density of TiN on the $SiO_2$ substrate than those in the TiN film of Sample 4. That is, it was confirmed that the TiN films formed by performing the pre-process before forming the TiN films, and then performing the film-forming process after supplying an organic ligand-containing gas to the substrate had the higher particle ratio, higher density, and higher flatness of TiN on the $SiO_2$ substrate than those in the TiN film formed without performing the pre-process.

That is, by supplying the organic ligand-containing gas before forming the TiN film, it was confirmed that it is possible to promote the adsorption of a Ti element onto the wafer surface, thereby forming a TiN film having high coverage as a thin film.

According to the present disclosure in some embodiments, it is possible to improve the characteristics of a metal-containing film.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) supplying a gas containing an organic ligand to a substrate;
   (b) supplying a metal-containing gas to the substrate; and
   (c) supplying a first reducing gas to the substrate,
   wherein after (a), without supplying a purge gas between (a) and (b), a metal-containing film is formed on the substrate by performing (b) and (c) one or more times, respectively.

2. The method of claim 1, wherein the organic ligand contains a hydrocarbon group.

3. The method of claim 1, wherein the organic ligand contains an alkyl group.

4. The method of claim 3, wherein the alkyl group includes at least one selected from the group of an ethyl group, a propyl group, a butyl group, an isopropyl group, and an isobutyl group.

5. The method of claim 1, wherein the organic ligand contains an amine group.

6. The method of claim 1, wherein the gas containing the organic ligand contains a metal element.

7. The method of claim 6, wherein the metal element contained in the gas containing the organic ligand is different from a metal element contained in the metal-containing gas.

8. The method of claim 6, wherein the metal element contained in the gas containing the organic ligand is a non-transition metal element.

9. The method of claim 1, further comprising: (d) before (a), supplying a second reducing gas to the substrate.

10. The method of claim 1, further comprising: (e) after (a), supplying a second reducing gas to the substrate.

11. The method of claim 1, further comprising:
   (f) before (a), supplying a second reducing gas to the substrate; and
   (g) after (a), supplying the second reducing gas to the substrate,
   wherein (a) and (g) are performed multiple times.

12. The method of claim 9, wherein the second reducing gas is a gas different from the first reducing gas.

13. The method of claim 9, wherein the second reducing gas is the same gas as the first reducing gas.

14. The method of claim 1, wherein in (a), the gas containing the organic ligand is supplied to the substrate in a time-division manner.

15. The method of claim 1, wherein in (b), the metal-containing gas is supplied to the substrate on which the organic ligand is exposed.

16. A substrate processing apparatus comprising:
   a process container in which a substrate is accommodated;
   a gas supply system configured to supply a metal-containing gas, a first reducing gas, and a gas containing an organic ligand into the process container; and
   a controller configured to be capable of controlling the gas supply system so as to perform a process including:
   (a) supplying the gas containing the organic ligand to the substrate;
   (b) supplying the metal-containing gas to the substrate; and
   (c) supplying the first reducing gas to the substrate,
   wherein after (a), without supplying a purge gas between (a) and (b), a metal-containing film is formed on the substrate by performing (b) and (c) one or more times, respectively.

17. A method of processing a substrate, comprising:
   (a) supplying a gas containing an organic ligand to the substrate;
   (b) supplying a metal-containing gas to the substrate; and
   (c) supplying a first reducing gas to the substrate,
   wherein after (a), without supplying a purge gas between (a) and (b), and
   a metal-containing film is formed on the substrate by performing (b) and (c) one or more times, respectively.

18. A non-transitory computer-readable recording medium storing a program that causes, by a computer, a substrate processing apparatus to perform a process comprising:
   (a) supplying a gas containing an organic ligand to a substrate;
   (b) supplying a metal-containing gas to the substrate; and
   (c) supplying a first reducing gas to the substrate,
   wherein after (a), without supplying a purge gas between (a) and (b), a metal-containing film is formed on the substrate by performing (b) and (c) one or more times, respectively.

* * * * *